United States Patent [19]

Schmaderer et al.

[11] Patent Number: 4,849,288
[45] Date of Patent: Jul. 18, 1989

[54] COMPOSITE SUPERCONDUCTING FIBER

[75] Inventors: Franz Schmaderer, Heidelberg; Georg F. Wahl, Eppelheim; Cord-Heinrich Dustmann, Weinheim; Erich Fitzer, Karlsruhe; Karl Brennfleck, Karlsruhe; Manfred Dietrich, Karlsruhe, all of Fed. Rep. of Germany

[73] Assignees: Brown, Boveri & Cie. AG, Mannheim; Kernforschungszentrum Karlsruhe GmbH, Karlsruhe, both of Fed. Rep. of Germany

[21] Appl. No.: 882,581

[22] Filed: Jul. 7, 1986

[30] Foreign Application Priority Data

Jul. 5, 1985 [DE] Fed. Rep. of Germany ....... 3524082

[51] Int. Cl.⁴ ................. H01B 5/08; H01L 39/00; B05D 5/12
[52] U.S. Cl. .................... 428/366; 428/367; 428/368; 428/375; 428/378; 428/380; 428/381; 428/930; 427/62; 505/813; 505/884; 505/887; 174/125.1
[58] Field of Search ............ 174/126 S, 128 S; 427/62, 63; 428/366, 367, 368, 375, 665, 378, 930, 380, 381; 29/599; 505/813, 884, 887

[56] References Cited

U.S. PATENT DOCUMENTS

| 3,861,953 | 1/1975 | Basche et al. | |
|---|---|---|---|
| 4,299,861 | 11/1981 | Dietrich et al. | 427/62 |
| 4,414,428 | 11/1983 | McDonald | 174/126 S |
| 4,585,696 | 4/1986 | Dustmann et al. | 428/368 |

FOREIGN PATENT DOCUMENTS

| 0102489 | 3/1984 | European Pat. Off. | |
|---|---|---|---|
| 2600847 | 7/1977 | Fed. Rep. of Germany . | |
| 2856885 | 5/1980 | Fed. Rep. of Germany . | |
| 3017645 | 12/1980 | Fed. Rep. of Germany . | |
| 3319524 | 7/1984 | Fed. Rep. of Germany . | |
| 3440590 | 5/1986 | Fed. Rep. of Germany . | |
| 0013391 | 2/1978 | Japan | 174/126 S |
| 5988916 | 5/1984 | Japan . | |
| 609900 | 4/1985 | Japan . | |
| 1590256 | 5/1981 | United Kingdom . | |

Primary Examiner—Norman Morgenstern
Assistant Examiner—Margaret Bueker
Attorney, Agent, or Firm—Herbert L. Lerner; Laurence A. Greenberg

[57] ABSTRACT

A superconducting fiber of a superconducting fiber bundle includes a carrier fiber having an outer surface, and superconducting layers and separating layers alternatingly surrounding the outer surface of the carrier fiber and a method for producing the same.

16 Claims, 3 Drawing Sheets

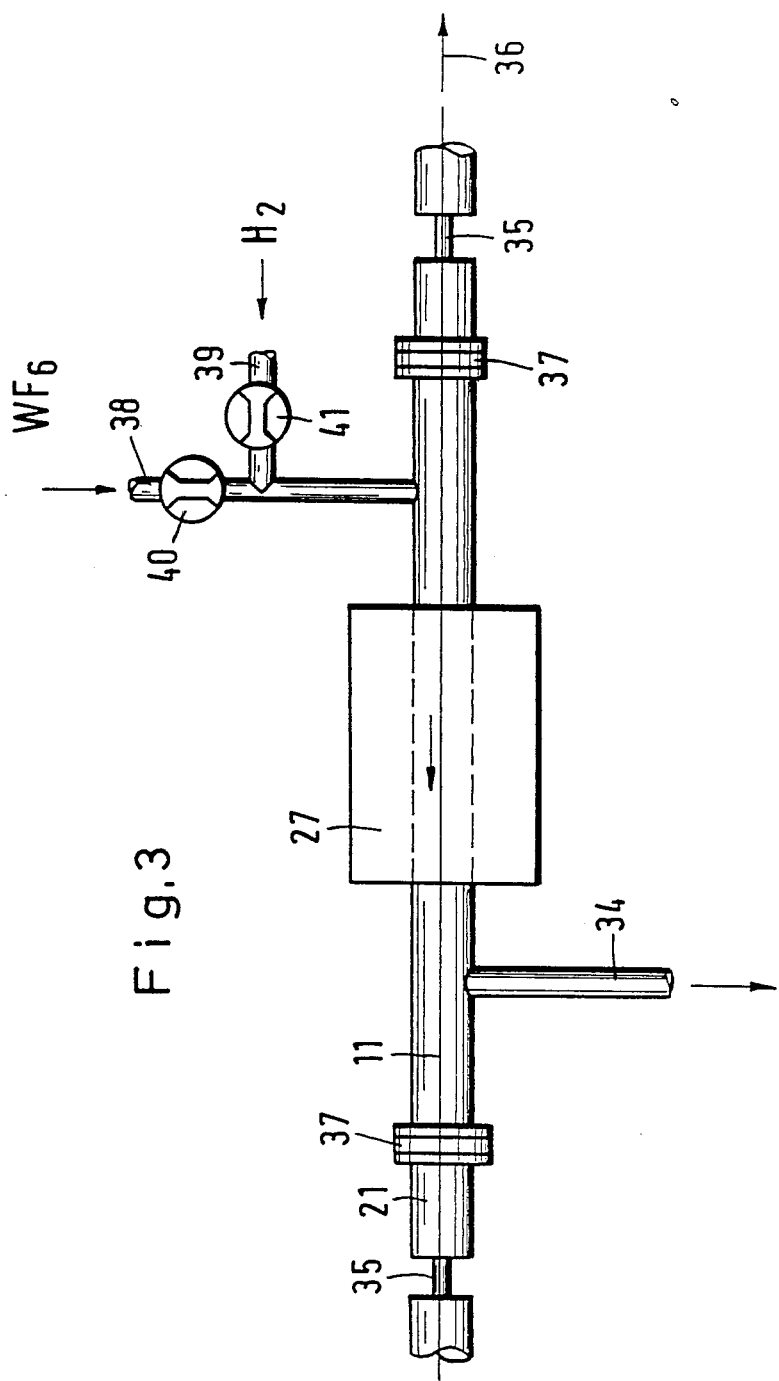

COMPOSITE SUPERCONDUCTING FIBER

The invention relates to a superconducting fiber of a superconducting fiber bundle, in which the outer surface of a carrier fiber is enclosed by a superconducting layer, especially formed of niobium carbonitride or niobium oxycarbonitride and to a method for manufacturing superconducting fiber bundles.

Heavy duty field magnets are required for the development of power technology with respect to nuclear fusion and superconducting generators, traffic engineering (magnetic suspension railroads), environmental technology (coal desulfurization) and high-energy physics. The heavy duty field magnets can only be economically manufactured on the basis of superconductors.

For such applications in particular, suitable carrier fibers having a high modulus of elasticity (such as C, B, steel) have been coated with superconductive material and combined in fiber bundles containing any desired number of individual fibers. The support fibers serve as a high tensile strength matrix and as a substrate for. the application of the superconducting layer. Niobium carbonitrides Nb(C,N) and niobium oxycarbonitrides having the general formula $NbC_xN_yO_z$ (where $x+y+z$ are smaller than or equal to 1), for instance, have become known as promising superconducting materials. Such niobium compounds are characterized by high critical temperatures, large critical magnetic fields and high critical current densities. They can be applied to the carrier fibers by a chemical gas precipitation process (CVD-chemical vapor deposition), in which the niobium is deposited by a reaction of $NbCl_5$ with $H_2$ in the presence of gases containing carbon and nitrogen gas, as a thin film. In this case, the CVD process is carried out either in one stage (simultaneous Nb deposition and carbonitration) or in two stages (Nb deposition and carbonitration following each other timewise).

Such a two-stage CVD method has become known from German Published, Prosecuted Application DE-AS 28 56 885 and the publication "Chemical Vapor Deposition of Superconducting Niobium Carbonitride Films on Carbon Fibres", by K. Brennfleck, M. Dietrich, E. Fitzer and D. Kehr, in the Proceedings of CVD, 7th International Conference, pages 300 to 314, The Electrochemical Society, Princeton, N. J., (1979). Furthermore, other improved methods have become known from European Patent No. 0102489 as well as from the publication ("CVD Processing of Carbon Fiber Superconductors", by M. Dietrich, C. H. Dustmann, F. Schmaderer and G. Whal, presented at the Applied Superconductivity Conference, 1982, Knoxville, Paper MB2, which are suitable for the fabrication of superconducting fiber bundles. Fiber bundles produced by these improved methods have a homogeneous "coating" on the individual fibers of the fiber bundle. Their superconducting layers are very fine-grained, so that high critical magnetic fields and high critical current densities are obtained because of the decrease of the free path length of the conduction electrons.

However, it has been found that the grain diameters of the superconducting crystals increase with increasing thickness of the superconducting layer. This leads to a situation in which layer thicknesses above about 100 nm, decrease the critical magnetic field and the critical current density On the other hand, small layer thicknesses only permit a small total current to flow because of their comparatively small cross section, so that in order to provide a sufficient current-carrying capacity of a superconducting fiber bundle, the number of fibers must be correspondingly large. However, the total current density of the fiber bundle cannot be increased by increasing the number of fibers.

It is accordingly an object of the invention to provide a superconducting fiber and a method for manufacturing the same, which overcomes the hereinafore-mentioned disadvantages of the heretofore-known devices of this general type, which have high values of the critical magnetic field strength and the critical current density and through which fiber bundles with a high overall current density are obtained.

With the foregoing and other objects in view there is provided, in accordance with the invention, a superconducting fiber of a superconducting fiber bundle, comprising a carrier fiber having an outer surface, and superconducting layers and separating layers alternatingly surrounding the outer surface of the carrier fiber.

The separating layers act as a barrier material. They permit the development of thin superconducting layers with a fine grain structure, wherein superconducting layers that are on top of each other are connected to each other in a conducting manner by the separating layer located between them. The fiber according to the invention therefore has a relatively thick total coating with very fine-grained superconducting material, so that a high critical field strength and a high overall current density of the fiber bundle can be achieved In accordance with another feature of the invention, the superconducting layers are formed of a material from the group consisting of niobium carbonitride and niobium oxycarbonitride, and the separating layers are formed of a material from the group consisting of high-melting metals and high-melting metal alloys.

High-melting metals and metal alloys make suitable separating layer materials since they have large diffusion constants, they serve as adhesion agents and they connect the superconducting layers to each other in a conducting manner. The choice of the number of separating layers depends, among other things, on the diameter of the carrier fiber and the required critical overall current density of the superconducting fiber bundle.

Not all carrier fiber materials can be coated with superconductive material (such as niobium carbonitride) without difficulty, due to the different surface qualities. Thus, for instance, a high tensile strength carbon fiber which exhibits good surface activity can be coated relatively easily with niobium carbonitride by means of CVD, while homogeneous coating of high-modulus fibers (graphitized carbon fiber with a crystalline structure which are particularly well suited because of their favorable physical properties such as the modulus of elasticity and elongation at fracture) causes particular difficulties.

In accordance with an added feature of the invention, there is provided a base layer covering the carrier fiber formed of a material from the group consisting of high-melting metals and high-melting metal alloys. This is done in order to achieve far-reaching independence of the type of carrier fiber In this way, a fiber protection is provided which protects the carrier fiber from chemical attack (methane formation) during the further coating.

Superconducting fibers with a base layer covering the carrier fiber have already become known from German Pat. No. DE-PS 33 19 524, corresponding U.S. Pat. No. 4,585,696. In that device, base layer materials of carbides or oxides are described without referring to a multilayer structure disposed thereon In accordance with a further feature of the invention, the base layer and/or at least one of the separating layers are formed of tungsten The tungsten applied by a CVD method adheres to all types of carbon fibers equally well. Since the diffusion constant of tungsten with respect to hydrogen and carbon is small, tungsten is particularly well suited as a diffusion barrier, so that the formation of hydrocarbons, which can lead to separation of the niobium carbonitride layer from the carrier fiber is avoided. The differences between the surface properties (for instance, between the high-tensile strength carbon fibers and high-modulus fibers) are cancelled out by the tungsten covering layer.

The tungsten surface of the base layer and the separating layers has favorable nucleation conditions for niobium carbonitride or niobium oxycarbonitride, so that it favors the formation of a fine-grain structure of the superconducting layer.

In accordance with again another feature of the invention, the base layer and/or at least one of the separating layers are formed of tantalum or a titanium alloy such as titanium nitride $T_iN$ or titanium carbide $T_iC$.

In accordance with again an additional feature of the invention, the base layer is formed of a material from the group consisting of silicone carbide $S_iC$ and tungsten carbide $W_iC$.

The layer thickness of the base layer and the intermediate layer is selected in such a way that, on the one hand, it is sufficient to form a closed layer and, on the other hand, it is as small as possible so that it contributes little to the overall diameter of the superconducting fibers.

In accordance with again an added feature of the invention, at least one of the base layers and the separating layers has a thickness between 5 and 20 nm. A thickness of 10 nm has been found to be an advantageous value. The layer thickness of the base layer can also be somewhat thicker in order to form a reliable carrier fiber protection.

In order to manufacture the fiber, there is provided a method which comprises alternatingly depositing superconducting layers and separating layers on a carrier fiber by chemical deposition from the gaseous phase.

In accordance with another mode of the invention, there is provided a method which comprises depositing the superconducting layers in the form of a material from the group consisting of niobium carbonitride and niobium oxycarbonitride by the action of niobium chloride, carbon and nitrogen compounds, and depositing the separating layers in the form of a material from the group consisting of high-melting metals and high-melting metal alloys.

In accordance with a concomitant mode of the invention, there is provided a method which comprises depositing a base layer formed of a material from the group consisting of high-melting metals and high-melting metal alloys between the carrier fiber and the alternating superconducting and separating layers by chemical deposition from the gaseous phase.

Other features which are considered as characteristic for the invention are set forth in the appended claims.

Although the invention is illustrated and described herein as embodied in a superconducting fiber and method for producing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 3 is an enlarged view of a portion of the CVD apparatus according to claim 2 which serves for applying a separating layer.

Figure 1:
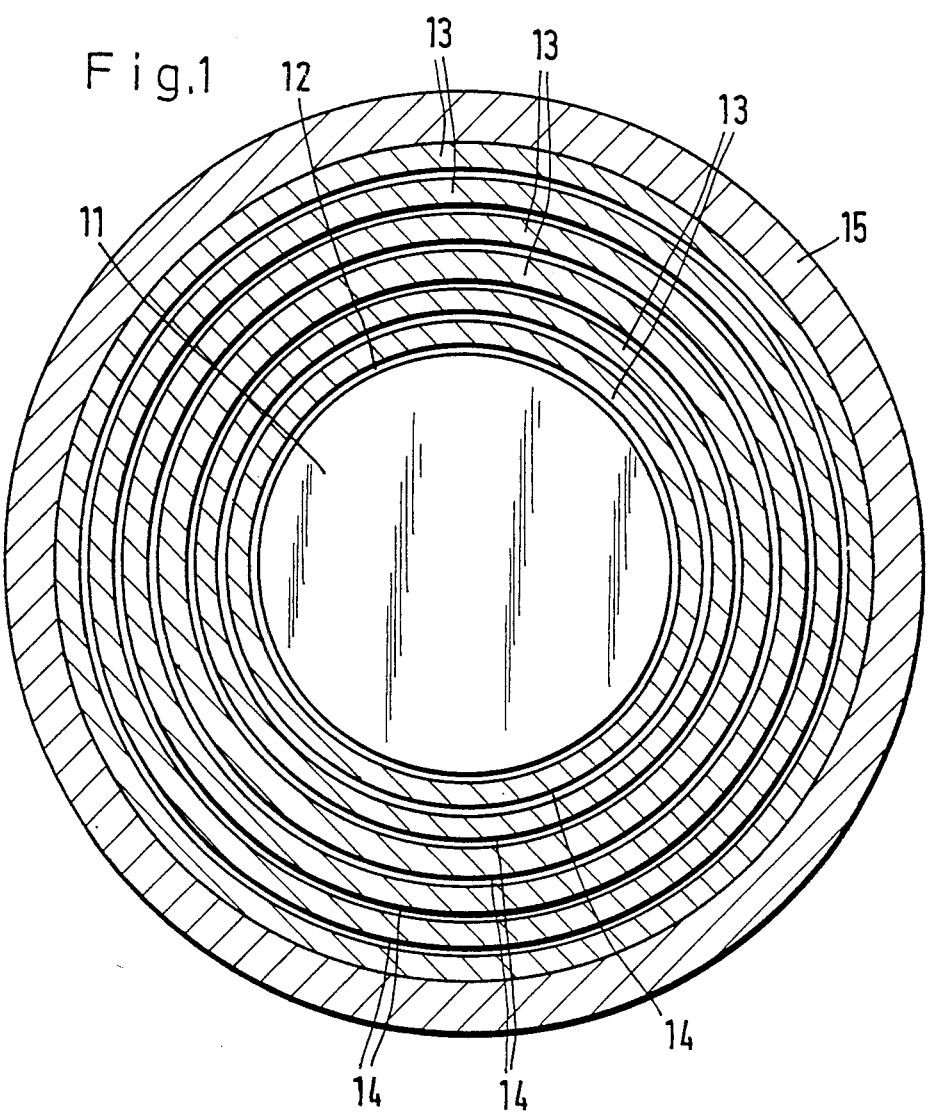
FIG. 1 is a diagrammatic, cross-sectional view of a superconducting fiber according to the invention.

Referring now to the figures of the drawings in detail and first, particularly to FIG. 1 thereof, there is seen a greatly enlarged diagrammatic view of the cross section of a superconducting fiber according to the invention, including a carbon fiber which serves as a carrier fiber 11 to which various concentrically disposed layers have been applied. The carrier fiber 11 is a high tensile strength carbon fiber or a high-modulus carbon fiber. A fiber formed of boron, steel or other high tensile strength materials can also serve as the carrier fiber 11.

The diameter of the carrier fiber 11, when formed on the basis of carbon, is between about 0.005 and to 0.007 mm. Applied to the carbon fiber 11 is a base layer 12 of silicon carbide $S_iC$ with a layer thickness of between 30 and 80 nm. However, the base layer can also be formed of tungsten The base layer is advantageously thicker than a separating layer since it serves primarily as a diffusion barrier and thus as a fiber protection. The base layer protects the carbon fiber against chemical attacks, when the outer layers are being applied in the CVD process. In particular, interaction between hydrogen and the carbon of the fiber is stopped, so that the adhesion of a coating to be applied can be increased substantially.

The base layer 12 is surrounded by several superconducting layers 13 of niobium carbonitride Nb(C,N) or niobium oxycarbonitride having the general formula $NbC_xN_yO_z$ where $x+y+z$ is smaller than or equal to 1. The superconducting layers 13 are separated from each other by separating layers 14 of tungsten The overall layer thickness of the superconducting layer 13 is, for instance, about 0.001 mm for carrier fibers 11 with a diameter of 0.007 mm and the overall layer thickness is about 0.0005 mm for carrier fibers 11 with a diameter of 0.005 mm. The layer thickness of a single superconducting layer 13 is preferably about 100 nm, and the layer thickness of a separating layer 14 is between 5 and 20 nm. The manufacturing cost of the superconducting fiber increases with the number of separating layers 11. However, the use of ten separating layers is still economically justifiable.

The multilayer structure on the carrier fiber 11 is covered by a jacket 15 formed of copper or aluminum, the layer thickness of which can be about 0.001 mm. The jacket 15 provides for the electrical stabilization of a superconducting fiber and carries the electric current in the normal conducting state.

Figure 2:
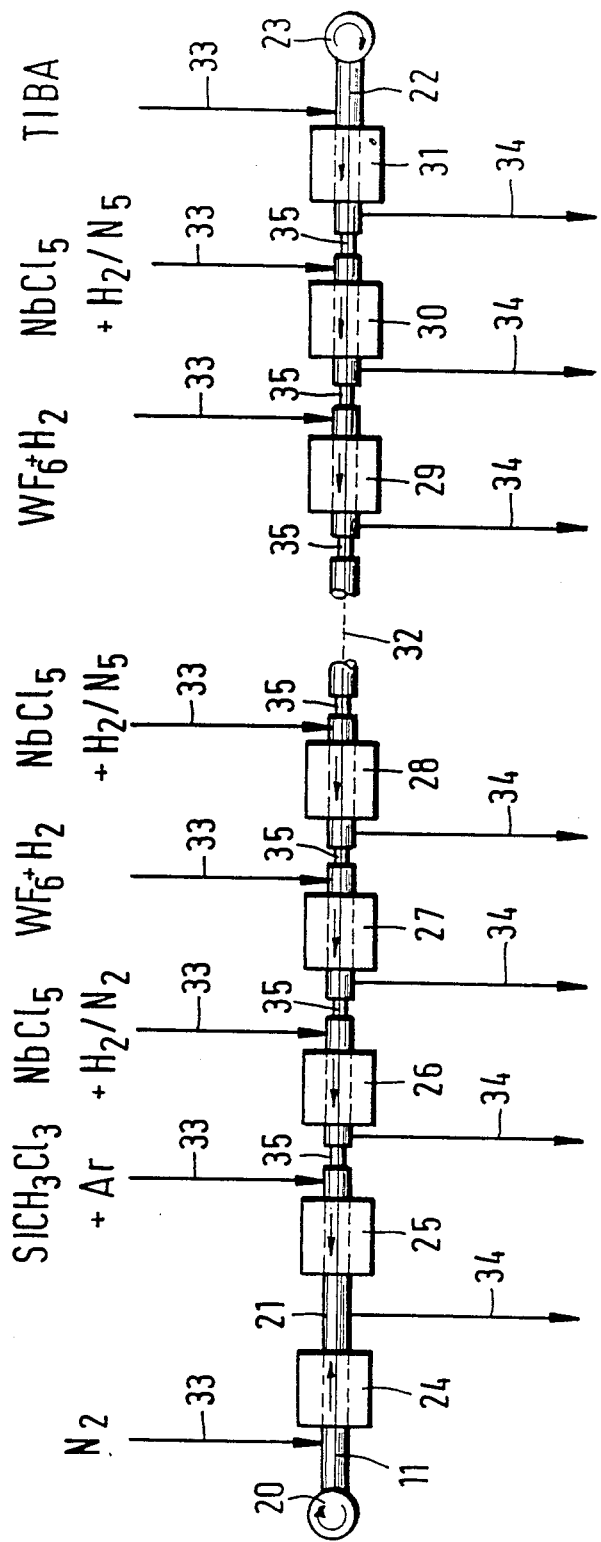
FIG. 2 is a fragmentary, elevational view of a CVD (chemical vapor deposition) apparatus for fabricating a fiber bundle formed of superconducting fibers, according to the invention.

FIG. 2 shows a deposition apparatus, by means of which the simultaneous coating of a multiplicity of carrier fibers is accomplished, for fabricating a superconducting fiber bundle which is formed of individual superconducting fibers according to the invention.

An unwinding chamber 20 contains a reel of raw material with uncoated carrier fibers 11, also known as a carbon fiber bundle. The carrier fibers 11 are pulled by a non-illustrated fiber transport device through a quartz tube 21 in which the coating of the carrier fibers 11 takes place. The coated fibers 22 are wound on a take-up reel located in a take-up chamber 23.

During the transport from the unwinding chamber 20 to the take-up chamber 23, the fiber bundle travels through a multiplicity of ovens 24 to 31 disposed one behind the other. The broken line 32 indicates that additional, non-illustrated ovens can lie along the fiber bundle path. In order to adjust the gas pressure required for the CVD processes in the vicinity of the ovens, several gas inlet stubs or connecting pieces 33 and pump stubs or connecting pieces 34 are located in the quartz tube 21. The quartz tube 21 has choke points 35 in the regions located between the ovens, through which the fiber bundle can be drawn. The choke points 35 prevent pressure equalization in the quartz tube 21 and permit an adjustment of different total and partial pressures in the vicinity of each oven.

If necessary, the carbon fibers 11 are cleaned in the first oven 24 by heating them in a nitrogen or hydrogen atmosphere The amount of gas inflow or feed ($N_2$) into the gas inlet stub 33 is, for instance, between 1 and 20 l per hour. The oven temperature is set to 600° to 1000° C. In the second oven 25, a base layer is applied by means of deposition of silicon carbide $S_iC$ from the gaseous phase of silicon methyltrichloride $CH_3SiCl_3$. Silicon methyltrichloride flows through the gas inlet stub 33 into the quartz tube 21 and is decomposed in the oven 25 at a partial pressure of about 50 mbar and a temperature between 1000° and 1100° C., into silicon carbides $S_iC$ and hydrochloric acid HCl, during the process of which the silicon carbide is uniformly deposited on the cleaned carbon fiber surface. The spent gas is pumped off through a pump stub 34, where the gas pressure of the gas mixture of argon and silicon methyltrichloride is set to about 1000 mbar.

The niobium carbonitride or niobium oxycarbonitride deposition occurs in the third oven 26. Only one oven 26 is illustrated in FIG. 2, in which a single-stage process takes place. However, two ovens can, of course, be used in tandem instead of the oven 26 for a two-stage deposition such as is described in European Patent No. 01 02 489 or in German Pat. No. DE-PS 33 19 524, corresponding to U.S. Pat. No. 4,585,696. The niobium deposition can take place with plasma activation and/or under the action of an ultrasonic field.

In the fourth oven 27, a separating layer 14 of tungsten is applied to the superconducting layer 13 by means of a CVD process. Details of this process will be explained below by making reference to FIG. 3. The fourth oven 27 is followed by other ovens 28 to 30 in which other superconducting layers 13 and other separating layers 14 are alternatingly deposited.

In the last oven 31, the outer superconducting layer 13 of the fiber is coated with a highly conducting aluminum layer 15. This is accomplished by a CVD process, in which aluminum is deposited on the fibers from the gaseous phase For this purpose, an organometallic compound, such as aluminum triisobutyl (TIBA) is introduced into the oven 31.

The quartz tube 21 (reactor) and the gas supply are constructed with suitably located flow resistances (choke points 35) and a suitable layout of the pumps connected to the pump stubs 34, in such a manner that the gases flow in the ovens 24 to 31 in the direction of the arrows.

FIG. 3 shows an apparatus for applying a tungsten separating layer 14 by means of CVD precipitation. The carrier fiber bundle 11 is transported in the direction of an arrow 36 through a closed quartz tube 21. The quartz tube 21 is formed of several sections which are joined together by flanges 37. The quartz tube 21 extends through an oven 27. The quartz tube 21 has a choke point 35 on each side of the oven 27, each of which is constructed in such a way that the fiber bundle can be pulled through it but a gas exchange is largely prevented.

A gas inlet stub or connecting piece 38 introduces tungsten hexafluoride $WF_6$ and another gas inlet stub or connecting piece 39 introduces hydrogen $H_2$ into the reaction space, i.e. that part of the quartz tube 21 which is in the vicinity of an oven 27. Flow meters 40, 41 dose or meter the gases WF and $H_2$ taken from the bottles. For example, 12l/h hydrogen and 3l /h tungsten hexafluoride are introduced. The spent reaction gas is pumped off through a pump stub 34 and a negative or underpressure of 5 mbar, for instance, is set in the reaction space.

The deposition of the tungsten on the fiber takes place at a reaction temperature of between 250° and 600° C. (preferably about 450° C.) which can be adjusted by the oven 27 according to the reaction:

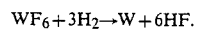

$$WF_6 + 3H_2 \rightarrow W + 6HF.$$

The foregoing is a description corresponding in substance to German Application P 35 24 082.2, dated July 5, 1985, the International priority of which is being claimed for the instant application, and which is hereby made part of this application. Any material discrepancies between the foregoing specification and the aforementioned corresponding German application are to be resolved in favor of the latter.

We claim:

1. Superconducting fiber of a superconducting fiber bundle, comprising a carrier fiber selected from the group consisting of carbon, steel and boron having an outer surface, a base layer covering said outer surface of said carrier fiber and being formed of a material from the group consisting of refractory metals and refractory alloys, superconducting layer selected from the group consisting of metal compounds and metal alloys-low temperature superconductors, and separating layers surrounding said base layer in alternation with said superconducting layers.

2. Superconducting fiber according to claim 1, wherein said superconducting layers are formed of a material from the group consisting of niobium carbonitride and niobium oxycarbonitride, and said separating layer are formed of a material from the group consisting of refractory metals and refractory alloys.

3. Superconducting fiber according to claim 1, wherein said base layer is formed of tungsten.

4. Superconducting fiber according to claim 1, wherein at least one of said separating layers is formed of tungsten.

5. Superconducting fiber according to claim 1, wherein said base layer and at least one of said separating layers are formed of tungsten.

6. Superconducting fiber according to claim 1, wherein said base layer is formed of tantalum.

7. Superconducting fiber according to claim 1, wherein at least one of said separating layers is formed of tantalum.

8. Superconducting fiber according to claim 1, wherein said base layer and at least one of said separating layers are formed of tantalum.

9. Superconducting fiber according to claim 1, wherein said base layer is formed of a titanium alloy.

10. Superconducting fiber according to claim 1, wherein at least one of said separating layers is formed of a titanium alloy.

11. Superconducting fiber according to claim 1, wherein said base layer and at least one of said separating layers are formed of a titanium alloy.

12. Superconducting fiber according to claim 1, wherein said base layer is formed of a titanium alloy from the group consisting of titanium nitride and titanium carbide.

13. Superconducting fiber according to claim 1, wherein at least one of said separating layers is formed of a titanium alloy from the group consisting of titanium nitride and titanium carbide.

14. Superconducting fiber according to claim 1 wherein said base layer and at least one of said separating layers are formed of a titanium alloy from the group consisting of titanium nitride and titanium carbide.

15. Superconducting fiber according to claim 1, wherein said base layer is formed of a material from the group consisting of silicon carbide and tungsten carbide.

16. Superconducting fiber according to claim 1, wherein at least one of said base layers and said separating layers has a thickness between 5 and 20 nm.

* * * * *